(12) United States Patent
Strauss

(10) Patent No.: US 6,667,673 B1
(45) Date of Patent: Dec. 23, 2003

(54) DUAL-MODE SURFACE WAVE FILTER WITH ENHANCED SYMMETRY AND OPTIONALLY ENHANCED STOP-BAND ATTENUATION

(75) Inventor: Georg Strauss, München (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 10/049,954

(22) PCT Filed: Jul. 26, 2000

(86) PCT No.: PCT/DE00/02448
§ 371 (c)(1),
(2), (4) Date: Feb. 19, 2002

(87) PCT Pub. No.: WO01/13514
PCT Pub. Date: Feb. 22, 2001

(30) Foreign Application Priority Data

Aug. 16, 1999 (DE) .......................... 199 38 748

(51) Int. Cl.[7] .................................. H03H 9/64
(52) U.S. Cl. ............ 333/195; 333/196; 310/310; 310/313 C; 310/313 D
(58) Field of Search ................. 333/193–196; 310/313 R, 313 B, 313 C, 313 D

(56) References Cited

U.S. PATENT DOCUMENTS

| | | | |
|---|---|---|---|
| 4,254,387 A | | 3/1981 | Redwood et al. ........... 333/194 |
| 5,936,487 A | | 8/1999 | Solal et al. ................. 333/193 |
| 5,994,980 A | * | 11/1999 | Tada .......................... 333/193 |
| 6,353,372 B1 | * | 3/2002 | Baier et al. ................. 333/195 |
| 2001/0054942 A1 | * | 12/2001 | Takamine et al. ........... 333/195 |

FOREIGN PATENT DOCUMENTS

| | | | |
|---|---|---|---|
| EP | 0 810 727 A2 | | 12/1997 |
| EP | 0836278 | * | 4/1998 |
| WO | WO 97/00556 | | 1/1997 |
| WO | 98/12809 | * | 3/1998 |
| WO | 98/57429 | * | 12/1998 |

* cited by examiner

*Primary Examiner*—Barbara Summons
(74) *Attorney, Agent, or Firm*—Schiff Hardin & Waite

(57) ABSTRACT

A dual mode SAW filter is provided with improved symmetry and/or blocking attenuation by selecting the structure in one-track, two-track embodiment and with potentially split track, in which first transducers and second transducers, these as input transducers and/or output transducers and/or coupling transducers (given a multi-track embodiment), always have an even-numbered plurality of fingers and are point-symmetrical.

7 Claims, 18 Drawing Sheets

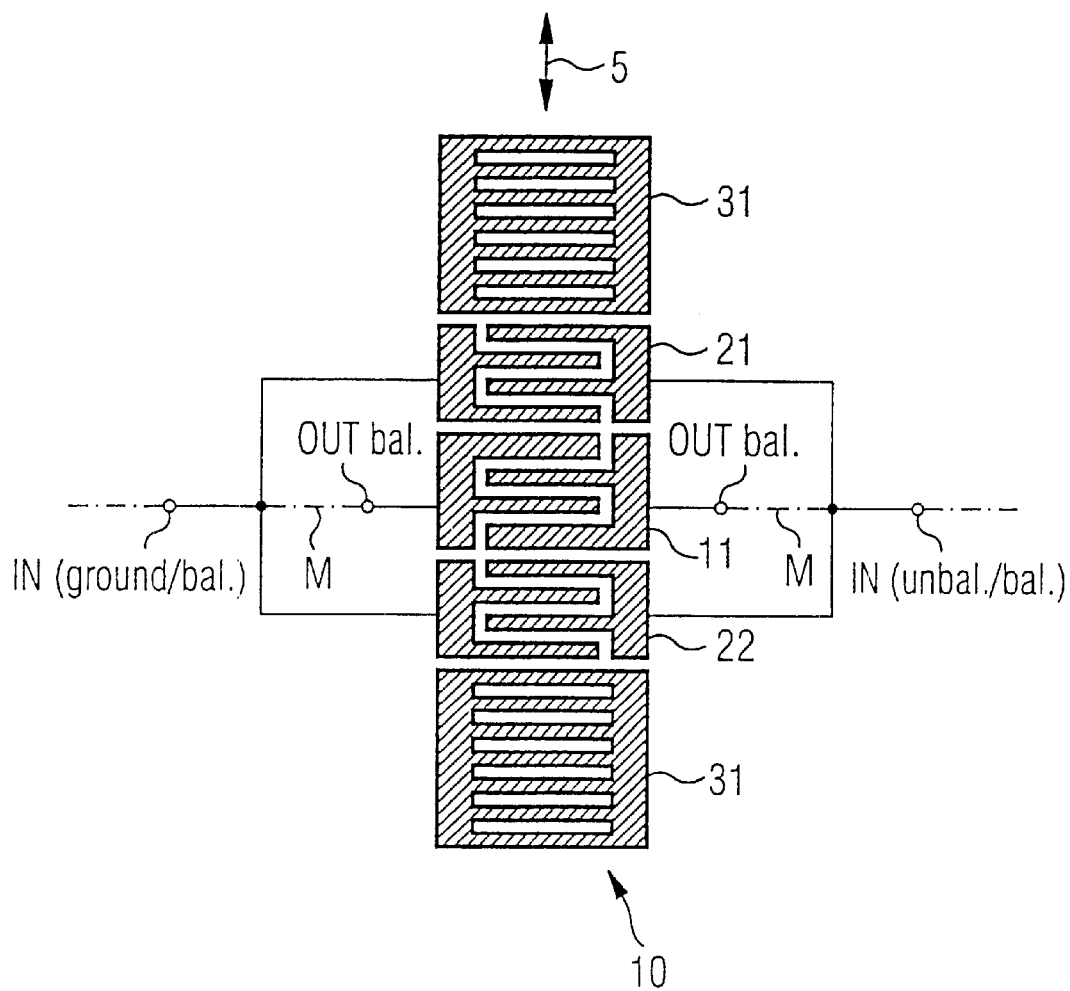

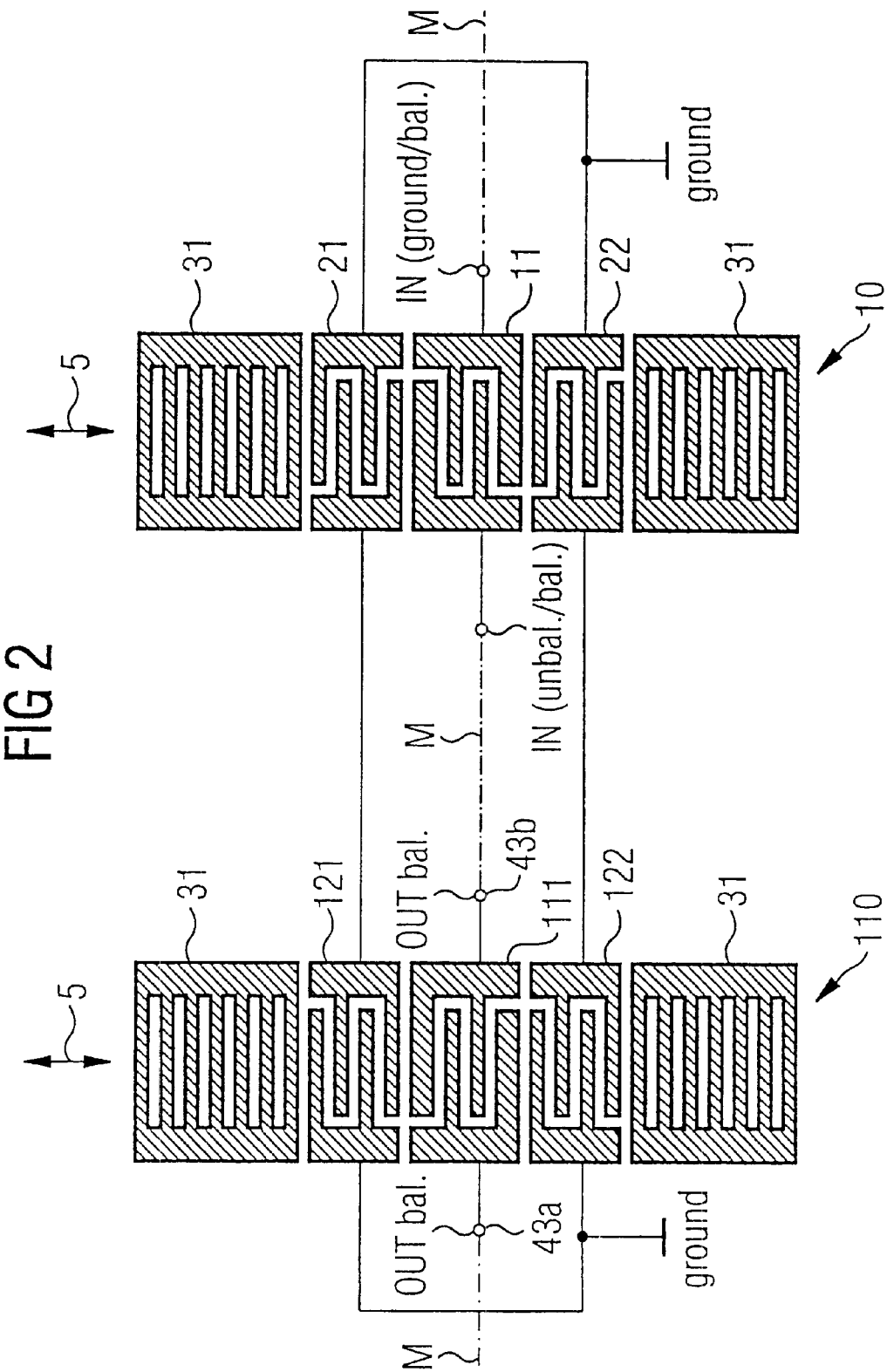

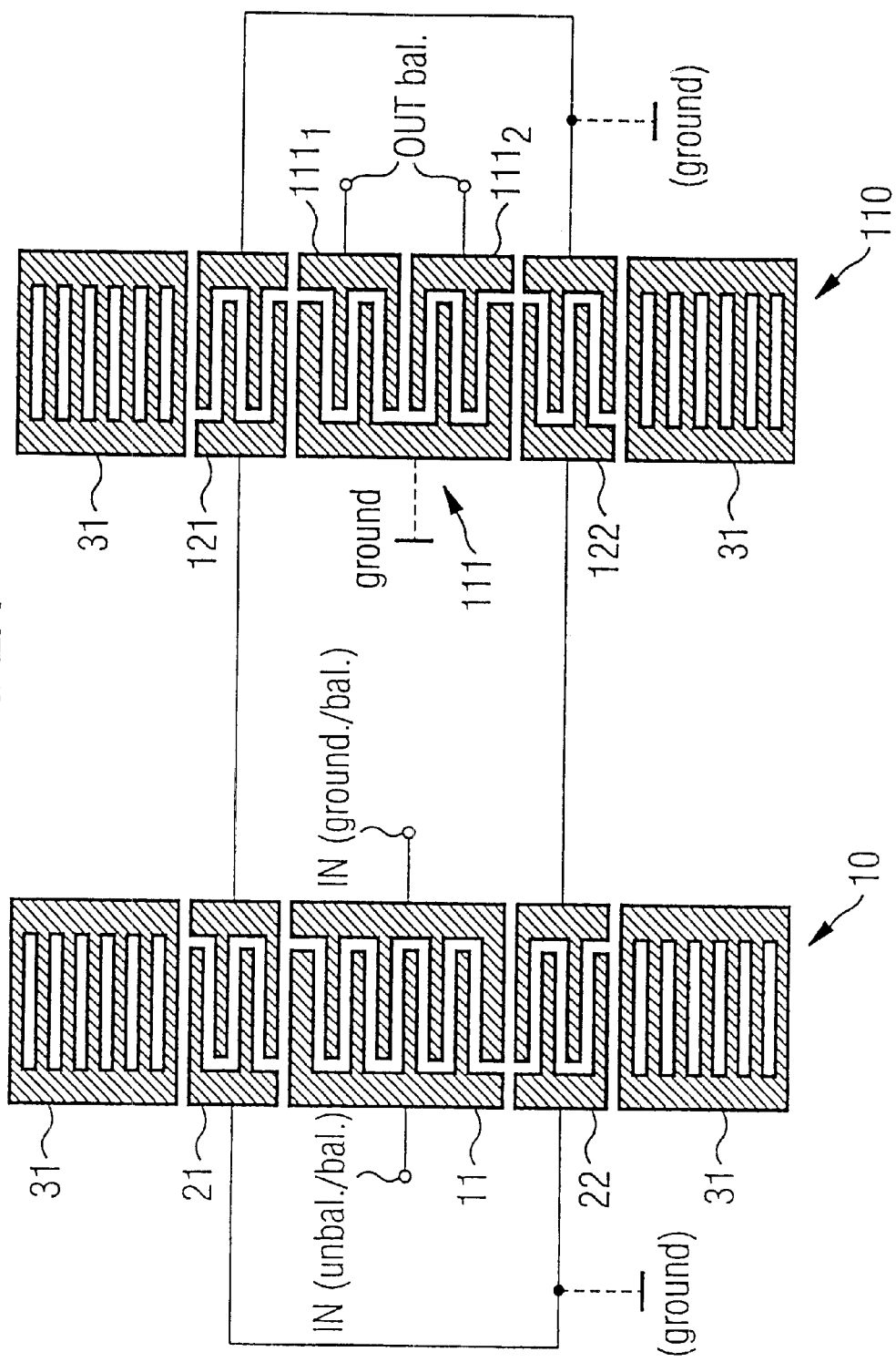

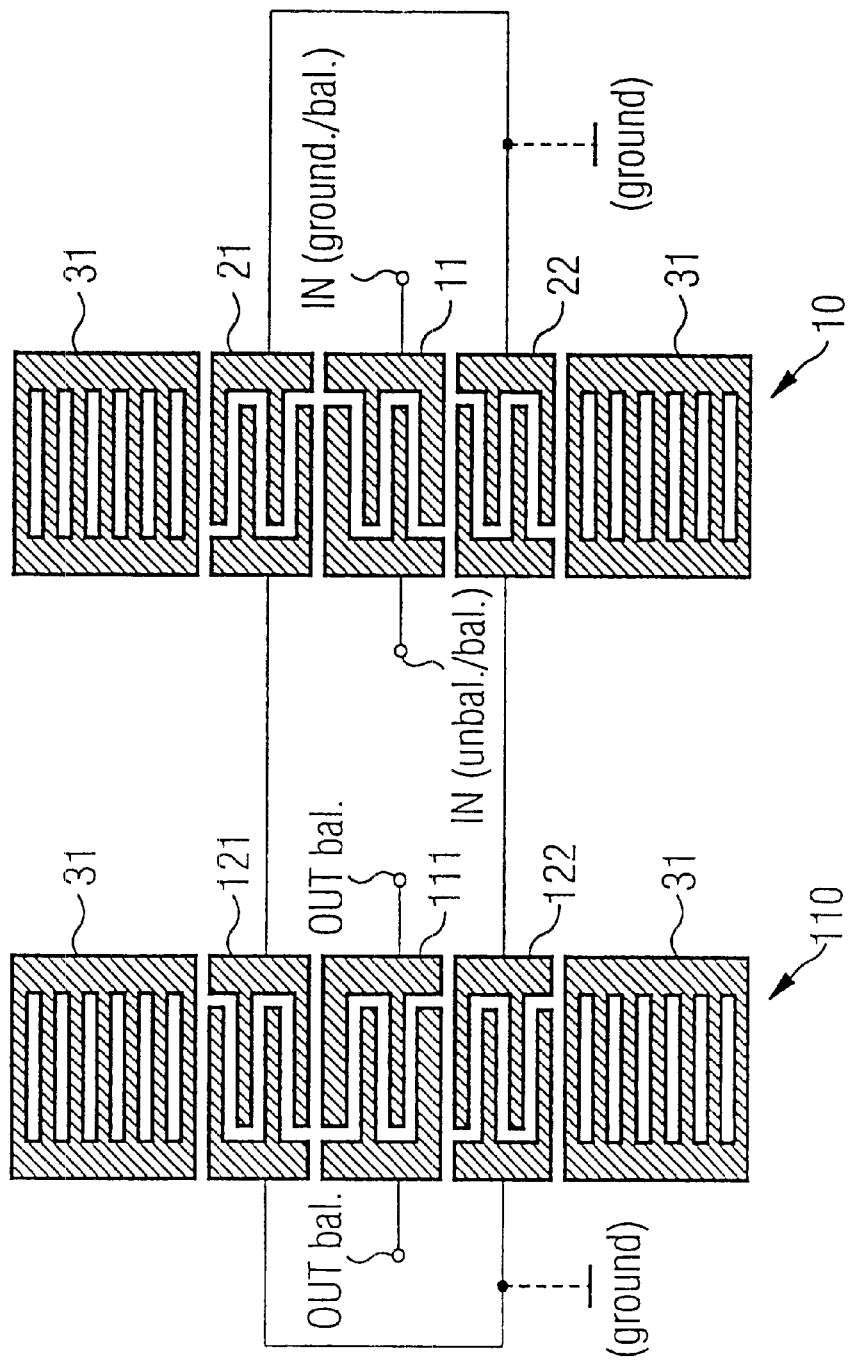

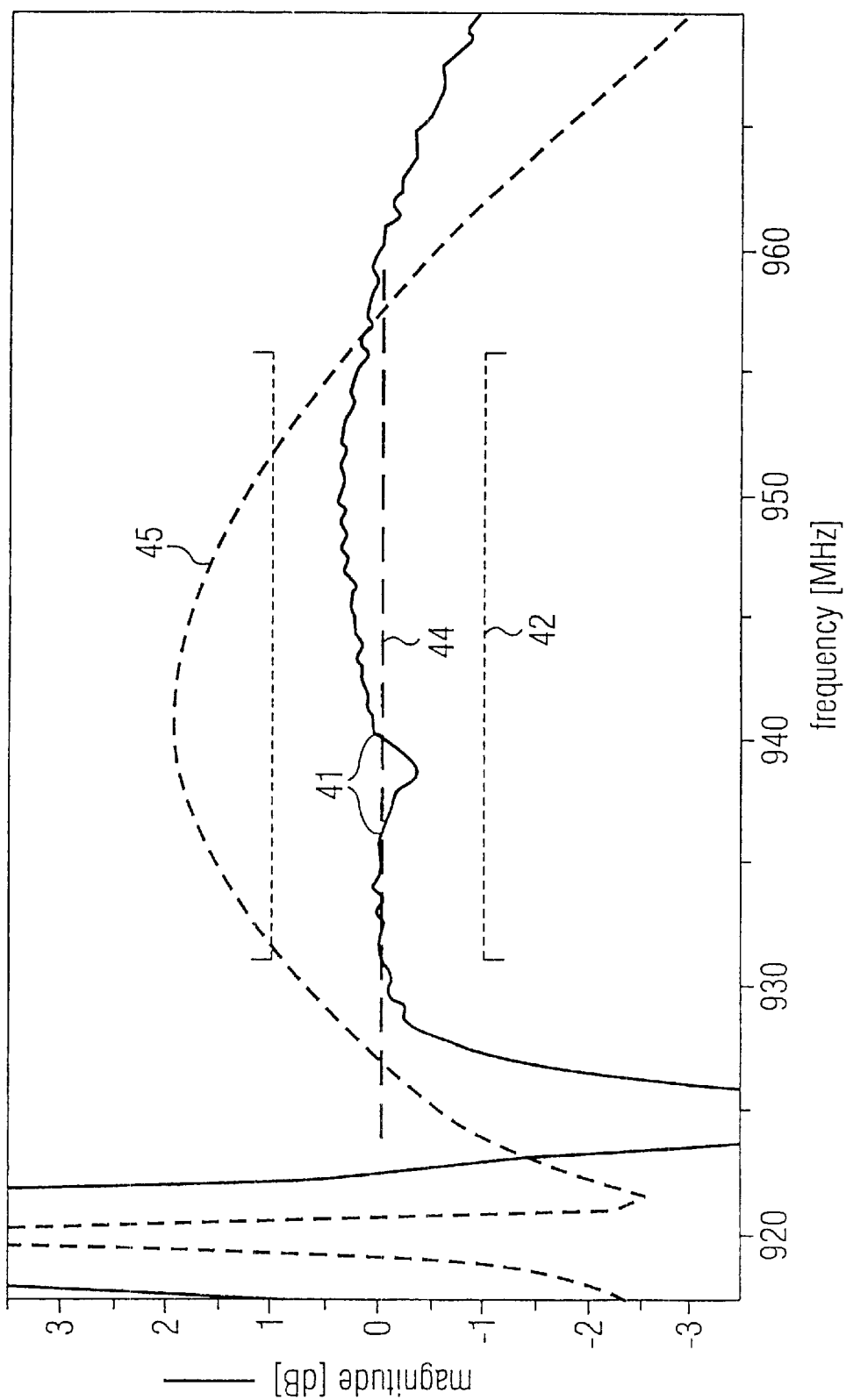

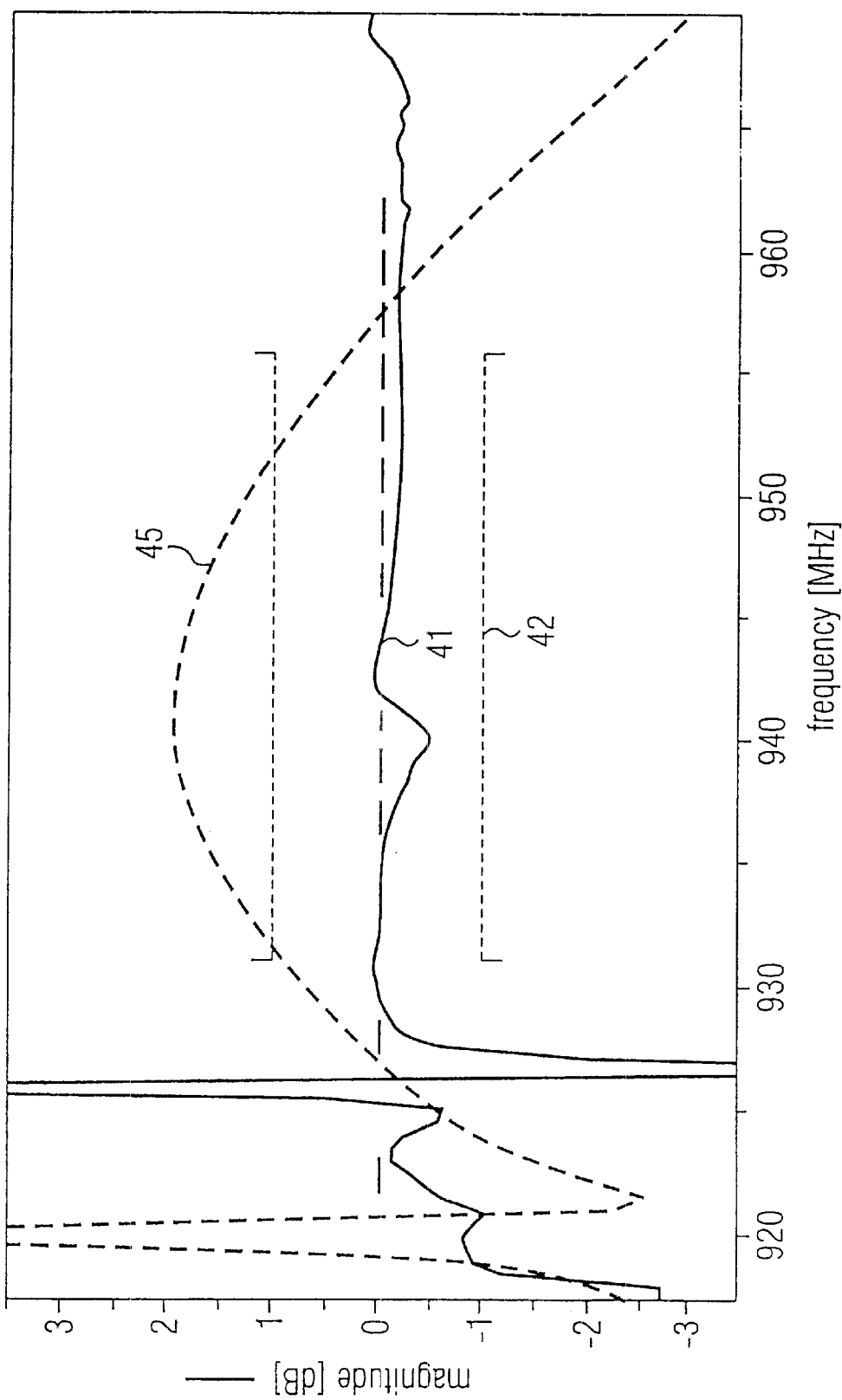

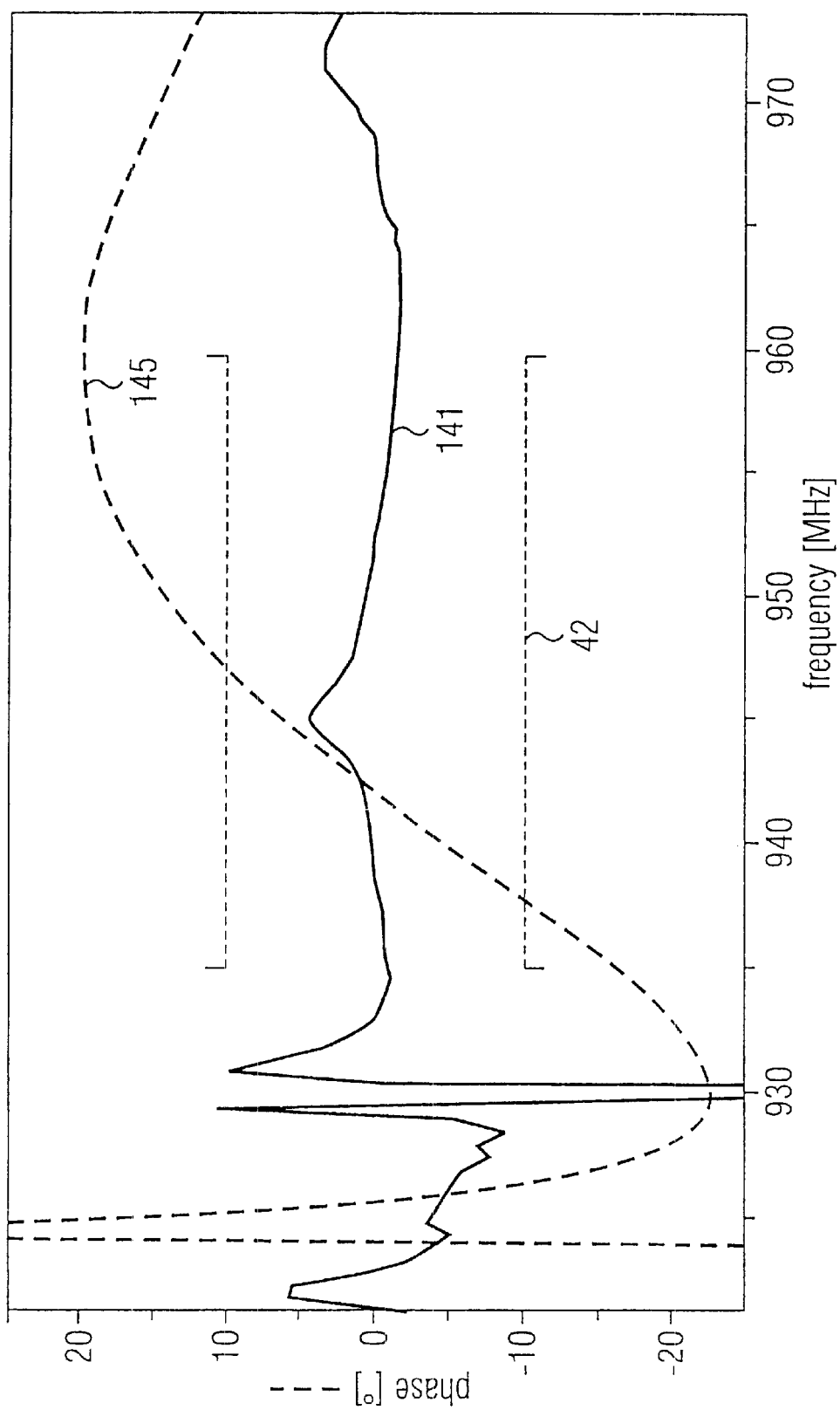

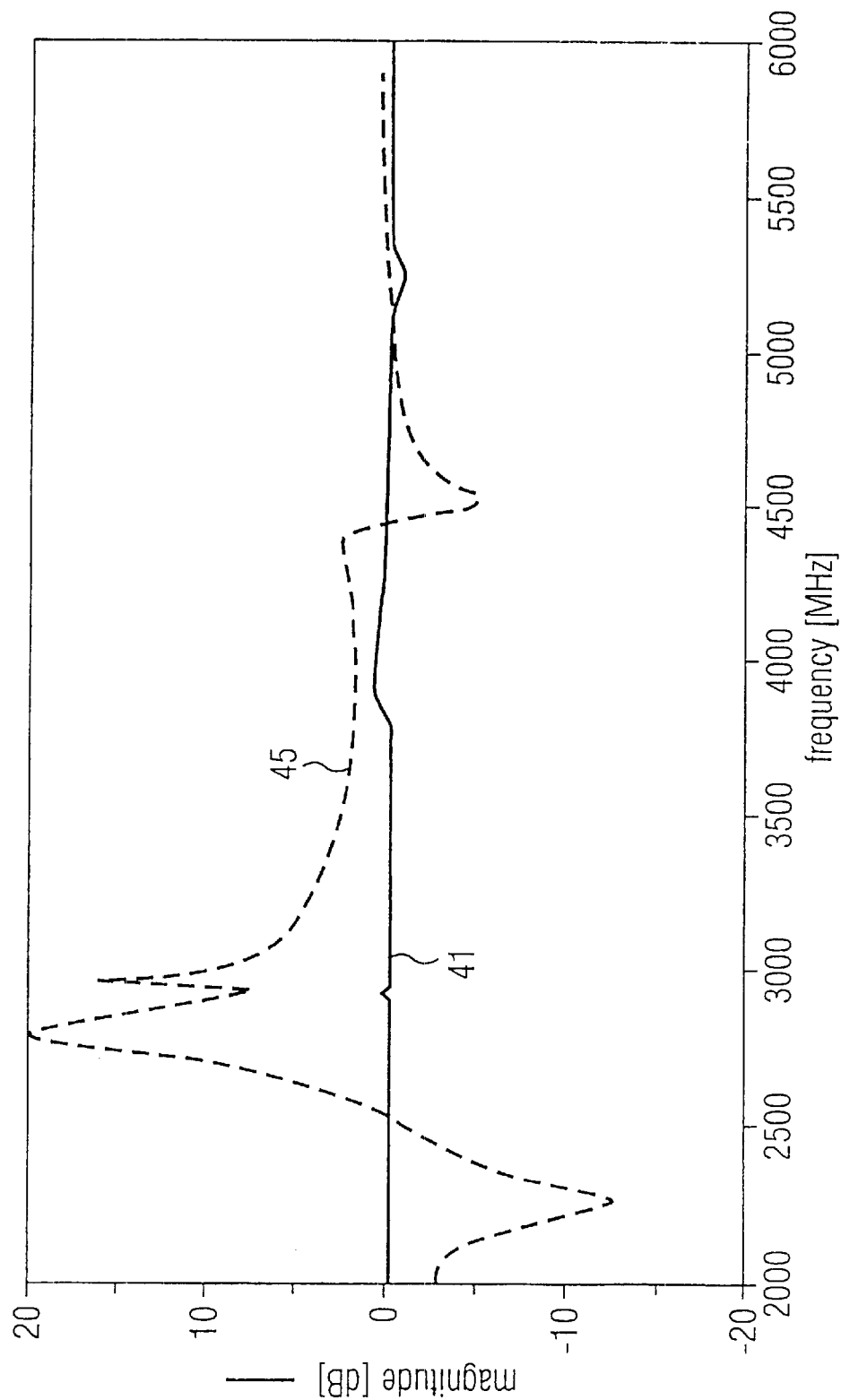

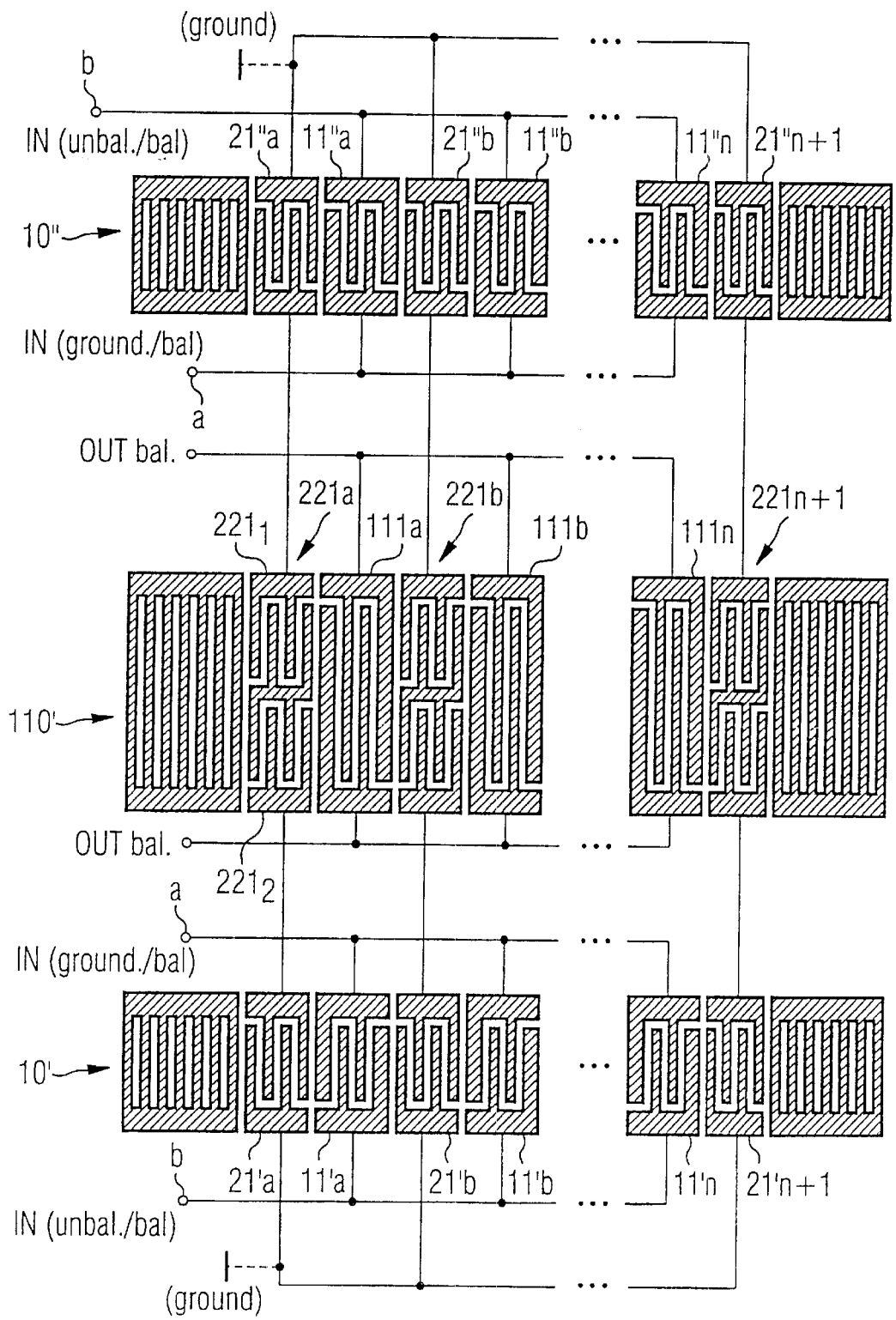

DUAL-MODE SURFACE WAVE FILTER WITH ENHANCED SYMMETRY AND OPTIONALLY ENHANCED STOP-BAND ATTENUATION

BACKGROUND OF THE INVENTION

1. Field of the Invention

The present invention is directed to a preferably ultra-selective high-frequency surface-active wave filter of that type that is referred to as dual mode surface-active wave (SAW) filter (DMS filter); this is also called a longitudinal mode resonator filter. These surface-active wave filters relate to electromechanical filters whose structure elements, such as transducers and resonators, are positioned on the surface of a piezoelectric substrate.

2. Description of the Related Art

The previously mentioned filters are known, for example, as one-track filters. For higher selection, filters are also produced and employed in which two such filter tracks are cascaded in a combined fashion into one filter and are arranged on a respective substrate. FIGS. 13A and 13B show a known single-track DMS filter and a known, cascaded two-track filter, the latter being composed of two one-track DMS filters interconnected with one another.

With reference to the respective surface-active wave track, these embodiments have respective end-residing resonator/reflector structures and respectively at least one interdigital structure as a transducer between these for signal input and for signal output.

The single track filter 10 shown in FIG. 13A comprises, a (first) transducer 1, two further (second) transducers 21, 22, and reflector structures 31. Here, the two transducers 21 and 22 are connected electrically in parallel with their alignment 5 as an input of the filter 10 for the surface wave 4 to be generated and used in the filter 10. As also indicated in FIG. 13A, these input transducers can be operated symmetrically or asymmetrically, with either a symmetrical signal input at both sides (IN bal/IN bal) or with an asymmetrical (IN unbal) input at one side to ground (IN ground). The terminals of the first transducer 1 employed as an output in this illustration are symmetrical outputs (OUT bal and OUT bal). The input and output can be interchanged in such a filter or can be employed in an interchanged manner.

FIG. 13B shows a known cascaded filter that comprises two tracks or, respectively, one-track filters 10, 110 connected to one another as shown. Reference characters of FIG. 13A are also employed here. Given this cascaded filter, for example, the transducer 1 is provided as an optionally asymmetrical/symmetrical input of the filter. The output of the filter is the transducer 1'. The other transducers 21, 121, 22, 122, as can be seen from the interconnection, are coupling transducers with which the two tracks 10 and 110 are electrically coupled to one another.

It is standard practice that the transducer 1 of the one-track arrangement according to FIG. 13A and the transducers 1 and 1' of FIG. 13B are always implemented in a mirror-symmetrical manner with reference to the center plane M perpendicular to the alignment 5 of the surface-active wave and, accordingly, have an uneven plurality of inter-engaging fingers. These are respectively five interdigitally arranged fingers of the transducers 1 and 1' in FIGS. 13A and 13B.

SUMMARY OF THE INVENTION

An object of the present invention is to provide an effective symmetry of the output signal of an appertaining filter given an asymmetrical or symmetrical input signal.

This object is achieved by a dualmode surface acoustic wave filter comprising an input terminal and an output terminal, at least one of the input terminal and the output terminal being balanced; a first filter track and a second filter track, each track comprising: at least one first transducer comprising an even-numbered plurality of transducer fingers electrically connected to a respective busbar and arranged interdigitally; a plurality of second transducers, each second transducer comprising an even-numbered plurality of transducer fingers electrically connected to a respective busbar and arranged interdigitally; and reflector structures; wherein: the second transducers serve as coupling transducers, the second transducers of the first filter track being electrically connected to respective second transducers of the second filter track, and the at least one first transducer of the first track serving as an input transducer; the at least one first transducer of the second filter track serving as an output transducer; at least one balanced terminal chosen from the input and output terminal being electrically connected to the busbars of the respective input and output transducer; in each filter track, a finger arrangement of the first transducer being point-symmetrical with respect to a center of the respective transducer; in each filter track, the at least one first transducer being arranged between two respective second transducers; in a respective track, a finger arrangement of the two second transducers being point-symmetrical to one another with respect to a center of the corresponding first transducer; or in a respective track, a finger arrangement of the two second transducers being mirror-symmetrical to one another with respect to an axis that is orthogonal to a wave propagation direction, which axis passes through the center of the corresponding first transducer.

DESCRIPTION OF THE DRAWINGS

Further explanations of the invention and its modified embodiments proceed from the description of the Figures belonging to the disclosure of the invention.

FIG. 1 is a pictorial diagram showing a dual mode single-track filter;

FIG. 2 is a pictorial diagram showing an inventive two-track filter having in-phase coupling between the two tracks;

FIG. 2A is a pictorial diagram showing a modification of the embodiment according to FIG. 2 in which the transducer is composed of two transducer parts connected electrically in series;

FIG. 3 is a pictorial diagram showing a construction of the two-track filter constructed such that the coupling between the two tracks ensues a in push-pull manner;

FIGS. 4A and 4B are graphs showing the improvement achieved with a filter having the embodiment of FIG. 2;

FIGS. 8A and 8B are graphs showing measured curves for the symmetry and for the phase curve;

FIGS. 9A and 9B are graphs showing the curve of the symmetry of the signal of the filter and the appertaining phase curve in the region outside the prescribed filter band, in the frequency range from 2 through 6 GHz;

FIG. 11 is a pictorial diagram showing a development of the embodiment of the invention of FIG. 7 that is essentially analogous to the development of FIG. 6 (and, thus, according to FIG. 5 as well) of the embodiments according to FIGS. 1 through 3;

DETAILED DESCRIPTION OF THE INVENTION

Figure 4B:
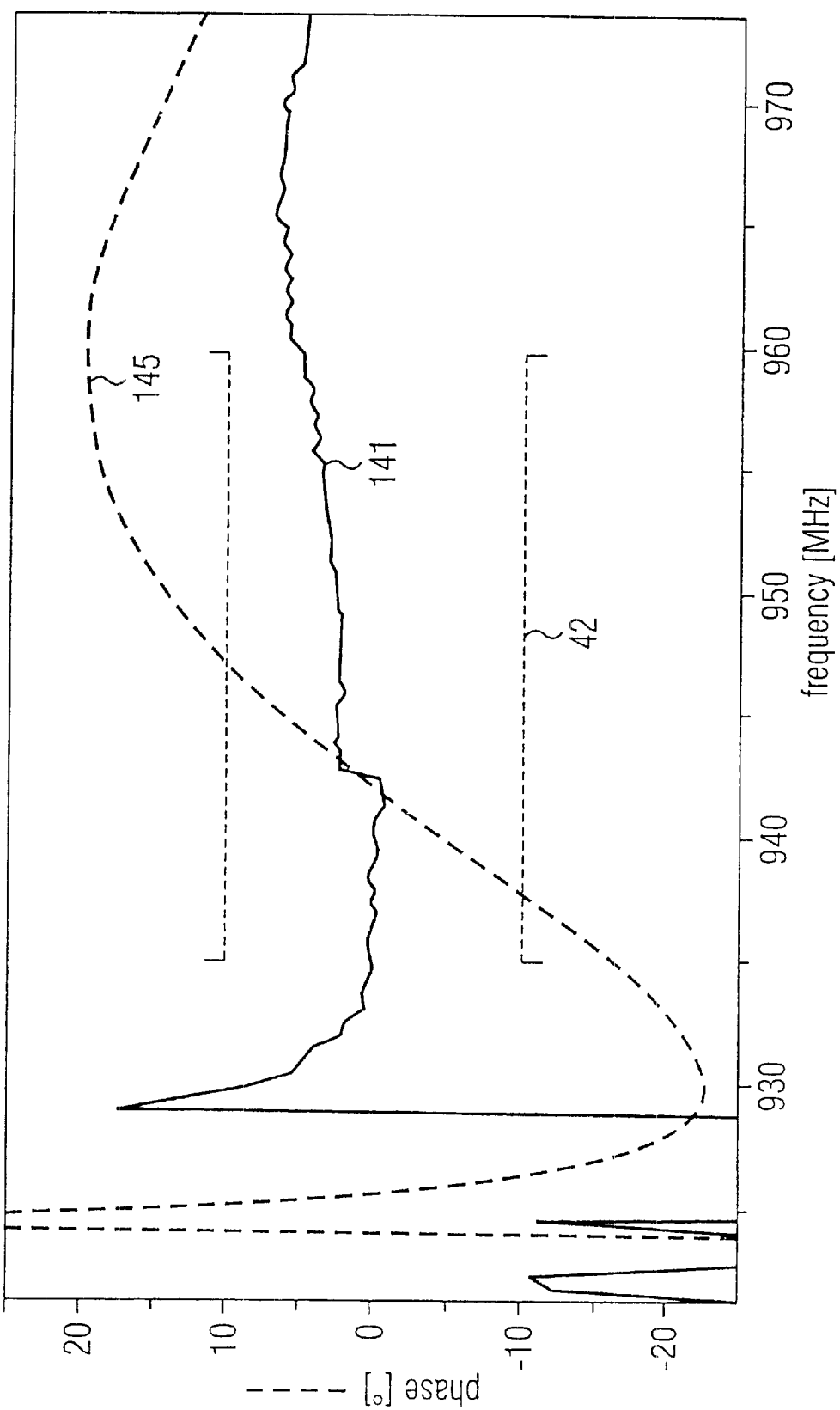

For the purposes of promoting an understanding of the principles of the invention, reference will now be made to the preferred embodiments illustrated in the drawings, and specific language will be used to describe these embodiments. No limitation of the scope of the invention is intended by this specific language, and the invention should be construed to encompass all embodiments that would normally occur to one of ordinary skill in the art.

Figure 13A:
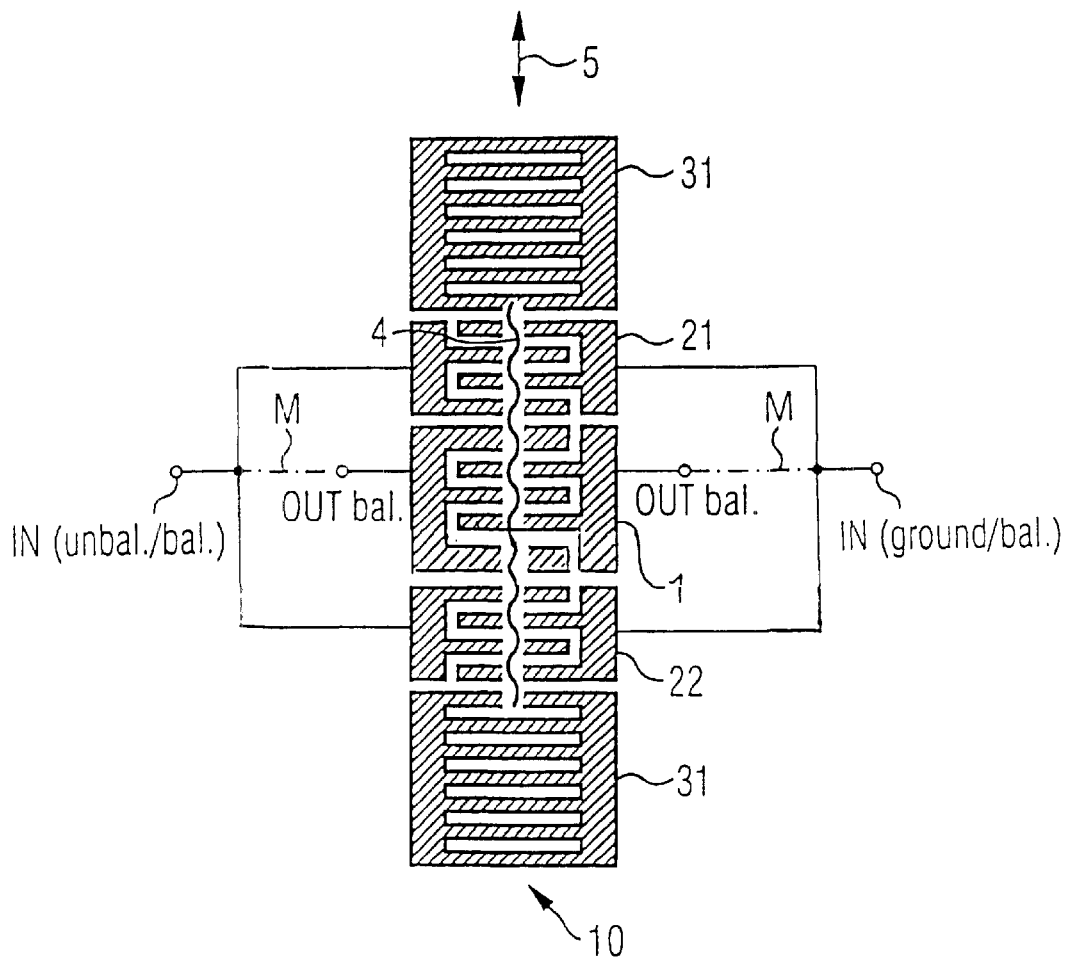
FIGS. 13A and 13B are pictorial diagrams illustrating a known single track and dual track filters respectively.

FIG. 1 shows a dual mode single-track filter with two (second) transducers 21 and 22 also connected electrically in parallel to one another here, similar to FIG. 13A, for example, as input. This input can be operated as a symmetrical or as an asymmetrical input as well. The inventively implemented (first) transducer 11 is connected as an output transducer to be symmetrically operated. This transducer 11 has an even number (e.g., four) of transducer fingers according to the invention. Although four transducer fingers are provided in the embodiment shown, any other (practical) even number of interdigitally inter-engaging transducer fingers can be provided in the framework of the invention, and thus the invention fundamentally differs from the prior art, namely from the transducer 1 having an odd number of fingers.

The filter of FIG. 1 supplies a symmetrical output signal both given a symmetrical as well as an asymmetrical input signal, namely with an especially high symmetry in conformity with the object of the invention.

FIGS. 2 and 3 each show an inventive two-track filter. As important to the invention, these filters differ from the prior art (FIG. 13B) in that the transducers 11 and 111 again have only an even-numbered plurality of electrode fingers. In the invention, these first transducers are not mirror-symmetrical with reference to the above-defined center plane M (perpendicular to the wave propagation direction 5), and the filter with this measure of the invention nonetheless exhibits improved symmetry. As already described for the prior art (FIG. 13B), the transducer 11 here forms, for example, the asymmetrical or symmetrical input, and the transducer 111 forms the symmetrical output with the terminals 43a, 43b of the filter. The respectively two (second) transducers 21 and 22 as well as 121 and 122 are interconnected with one another via busbars as coupling transducers. The filter according to FIG. 2 is a filter having in-phase coupling between the two tracks 10 and 110. The filter according to FIG. 3 is constructed such that the coupling between the two tracks 10 and 110 ensues in a push-pull manner. This is implemented in that the coupling transducers 22 and 122 have the reversed polar structure compared to FIG. 2. FIG. 3 indicates that a ground terminal in this filter is possible.

FIG. 2A shows a modification of the embodiment according to FIG. 2. The modification is that the (first) transducer 111 referenced as an output is composed of two transducer parts $111_1$ and $111_2$ connected electrically in series, each of which has an even-numbered (shown with four fingers) or an odd-numbered plurality of fingers as well. Given this filter, there is a 1:4 impedance transformation from the input (IN) to the output (OUT).

The multi-track inventive embodiments of such a dual-mode filter according to FIGS. 2, 2A and 3 have the additional advantage that the inventive filter according to FIG. 1 also yields a symmetry that is improved even further.

Figure 13B:
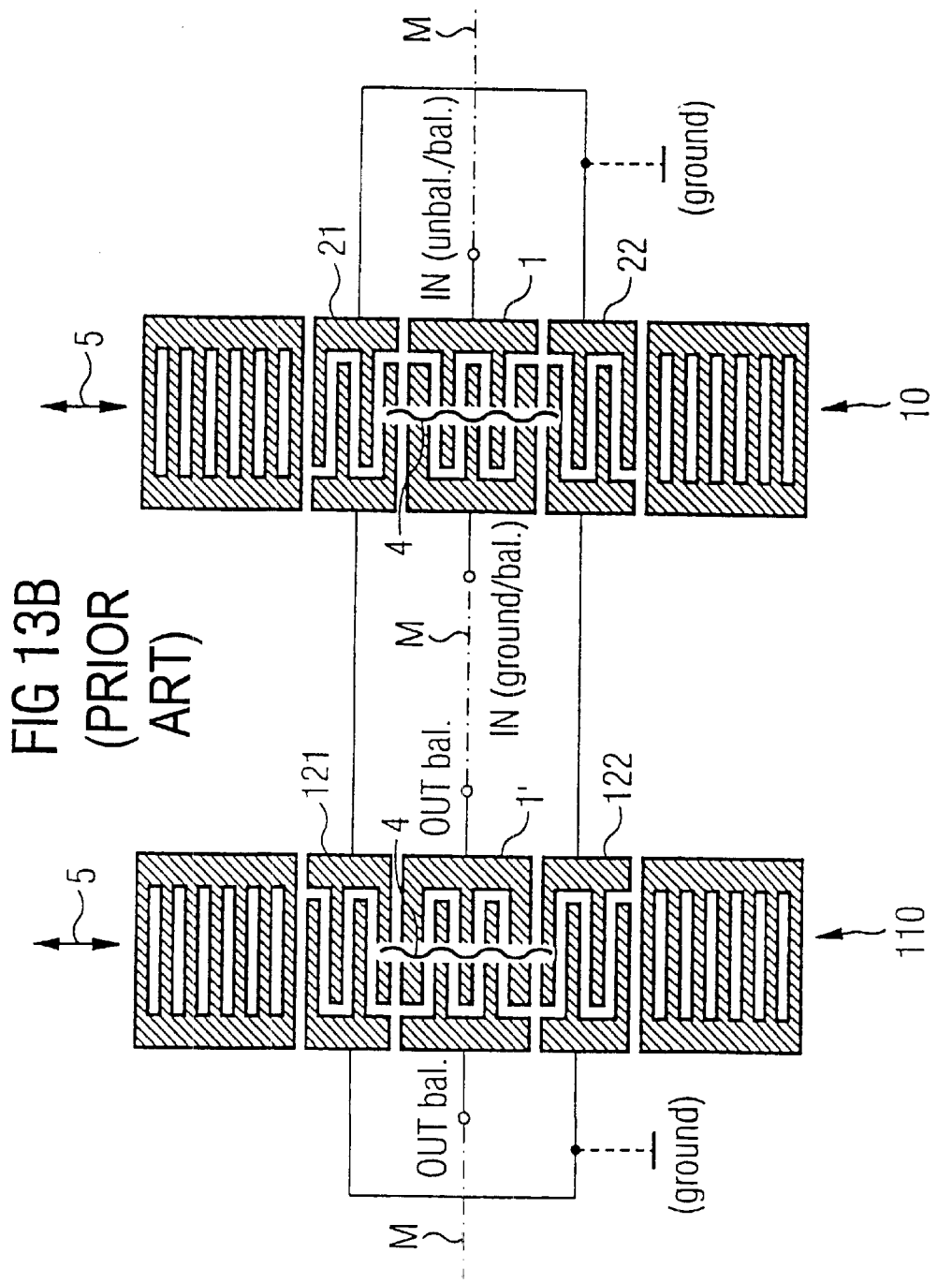

FIGS. 4A and 4B show the improvement achieved with a filter having the embodiment of FIG. 2, namely compared to a filter according to FIG. 13B. The measured curve representing the symmetry achieved is the curve 41 which is entered over the frequency for the prescribed frequency band 42. The measured curve 41 reproduces the signal ratio. This is the ratio of the individual signals to be measured given two two-port measurements at the terminals 43a, 43b (to ground). That terminal that is respectively not connected to the measuring instrument is respectively terminated with the reference characteristic impedance of the measurement system. As can be seen from FIG. 4A, this curve 41, i.e. the amount of the amplitude ratio, lies close to 0 dB (referenced 44 in the Figure). FIG. 4B shows—namely for the frequency band 42 again, the curve of the phase difference $\Delta\phi$ for the symmetrical output signal with the curve 141. As can be seen from FIG. 4B, the phase difference over the entire frequency band lies close to the value 180° (the FIG. 4B phase shown is $\Delta\phi-180°$).

The curves 45 for symmetry and 145 for phase difference are also entered with broken lines in FIGS. 4A and 4B, these having been determined at a filter of the prior art according to FIG. 13B. The progress achieved with the invention is thus obvious from FIGS. 4A and 4B.

Figure 5:
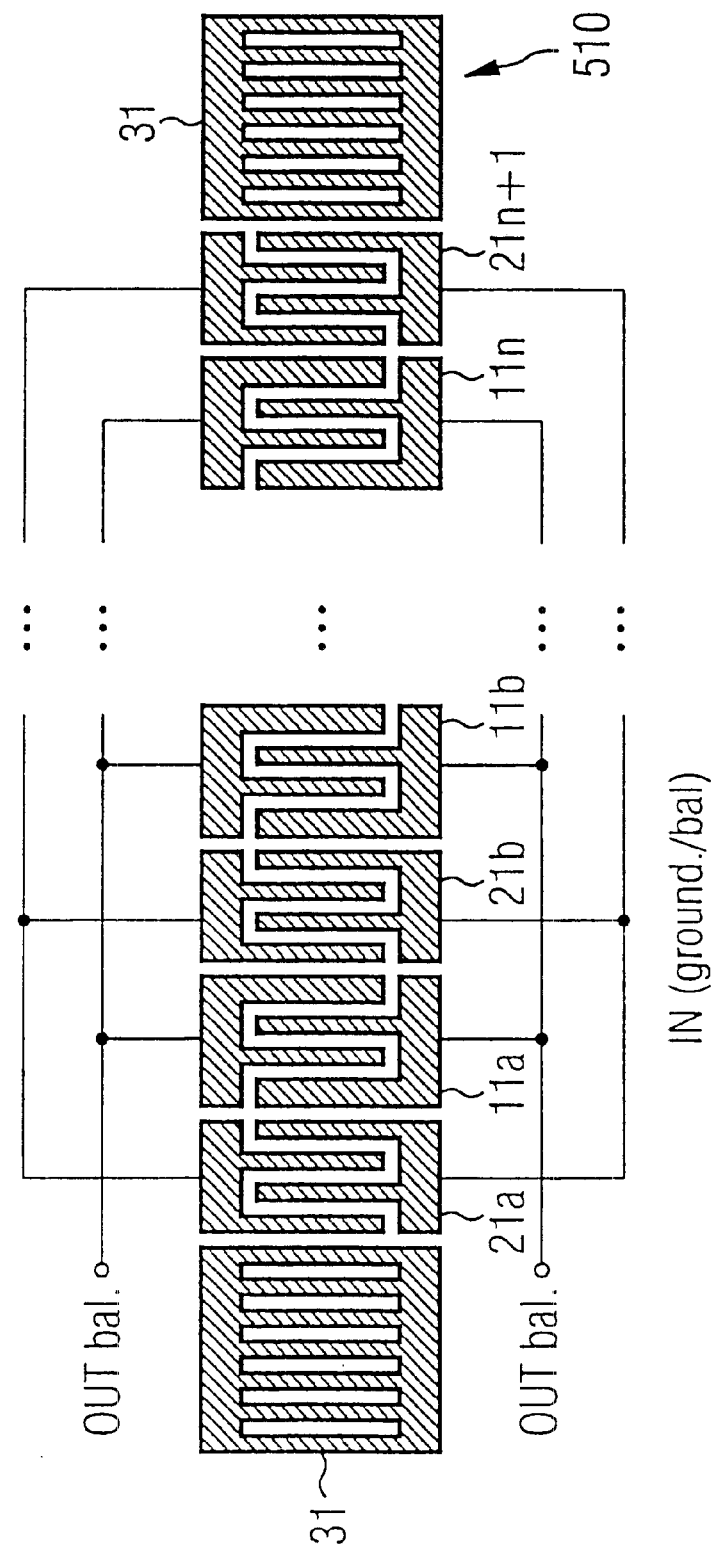
FIGS. 5 and 6 are pictorial diagrams showing a development of a filter according to FIG. 1 or, respectively, according to FIG. 3. The filter according to FIG. 6, with pole reversal of coupling transducers, is also a development of the filter according to FIG. 2.
Figure 6:
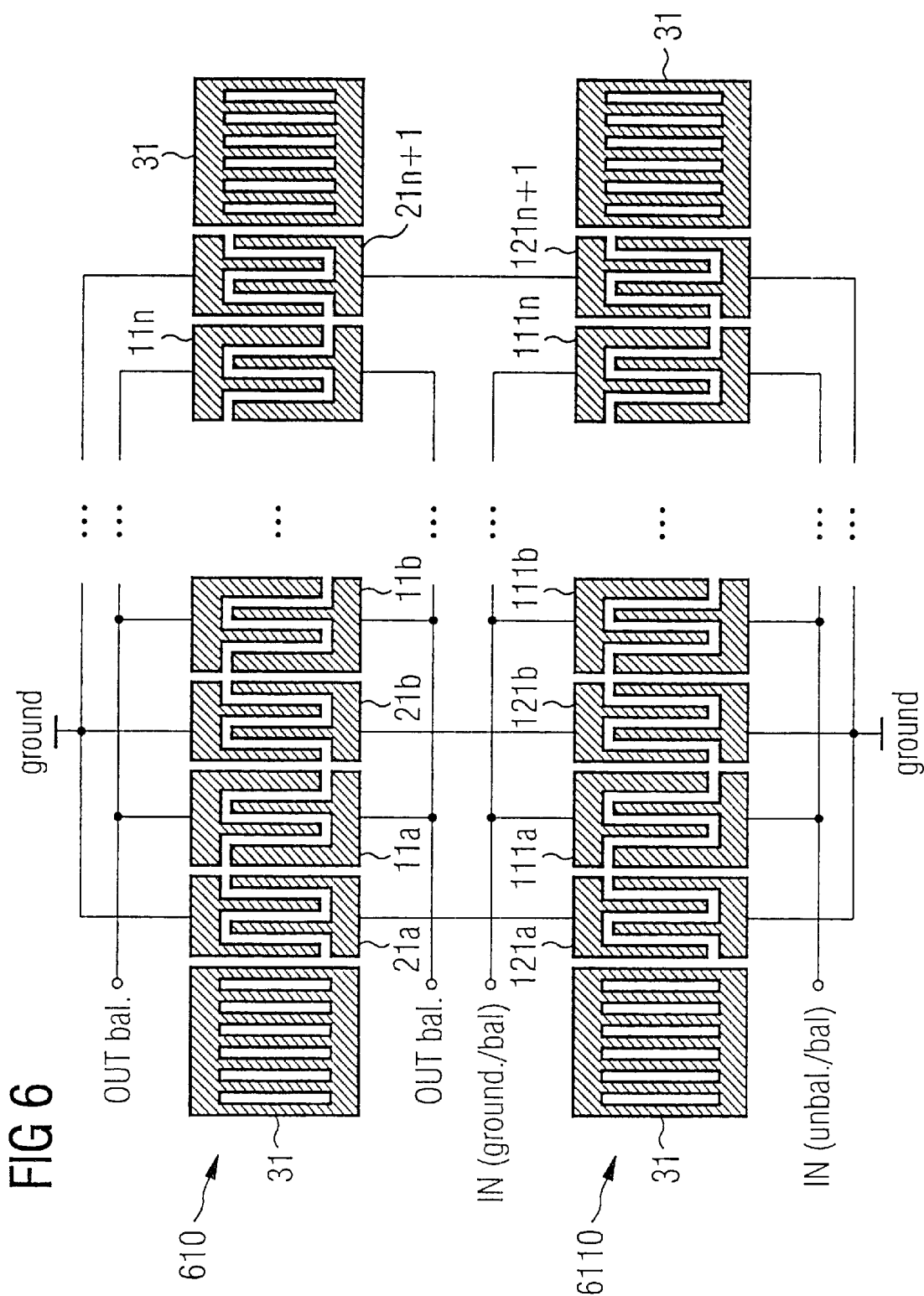

FIGS. 5 and 6 respectively show a development of a filter according to FIG. 1 or, respectively, according to FIG. 3. The filter according to FIG. 6, with pole reversal of coupling transducers, is also a development of the filter according to FIG. 2.

FIG. 5 shows what is here a multiply acousto-mechanically coupled one-track filter with the track 510 having transducers present in the filter in this track, all of which have a respectively even-numbered plurality of transducer fingers. The inventive teaching is thus also fulfilled given the filter of FIG. 5. A plurality (n) of (first) transducers $11a, 11b, \ldots 11n$ connected parallel is provided in the filter of FIG. 5, these corresponding to the first transducer 11 of FIG. 1. In FIG. 5, too, these transducers are connected, for example, as symmetrical output (n+1) (second) transducers likewise having an even-numbered finger plurality are provided with $21a, 21b, \ldots, 21_{n+1}$, these corresponding to the transducers 21 or, respectively, 22 of FIG. 1 and also being connected parallel to one another in FIG. 5 as an input of the filter. The appertaining reflector structures 31 are also shown. In particular, a greater bandwidth can be achieved given such an embodiment according to FIG. 5.

The filter of FIG. 6 is implemented with the tracks 610 and 6110 in an analogous way like the development corresponding to FIG. 5 of the two-track filter of FIG. 2 or, respectively, 3. In structure, the track 610 corresponds to the track 510 of the filter of FIG. 5 and to the track 10 of the filter according to FIG. 2. As a development, the track 610 in turn contains the transducers $11a, 11b, \ldots 11n$, on the one hand, and the transducers $21a, 21b, \ldots, 21_{n+1}$, on the other hand. Based on the way these transducers are respectively connected parallel to one another, these also serve as input transducers in the track 610 and as output transducer according to the interconnection to be derived from FIG. 6. The same is also true for the second track 6110 of the filter of FIG. 6 with the transducers 11$a$, 11$b$, . . . , 11$n$; 121$a$, 121$b$, . . . , 121$_{n+1}$ and respectively further transducers 11, 111 of the two-track filter of FIG. 6 with this development of the invention or a development of a filter according to FIG. 2 or, respectively, according to FIG. 3. The blocking attenuation outside the prescribed band can (also) be improved with these described measures.

Figure 7:
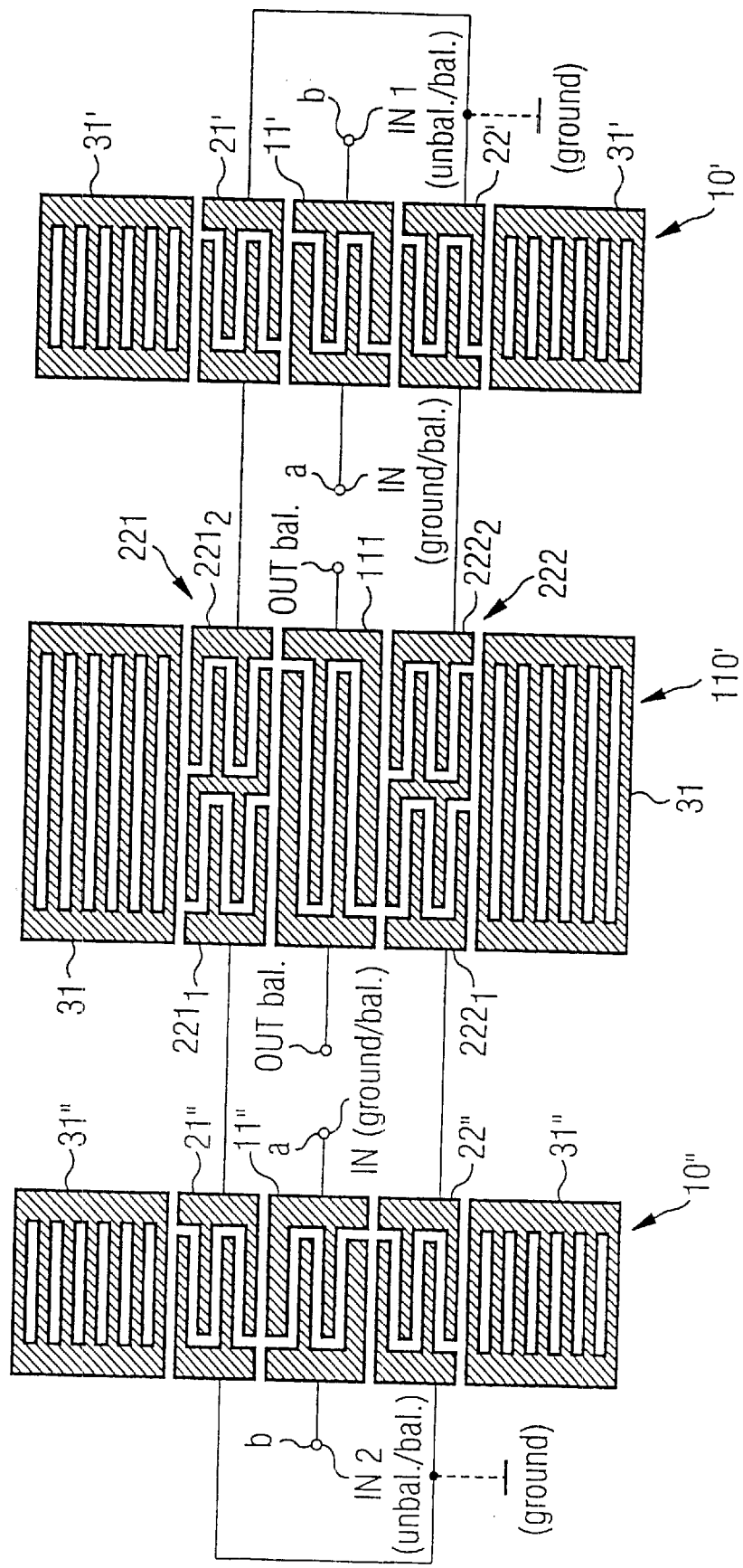
FIG. 7 is a pictorial diagram showing a further development of the invention with which (additionally) a higher blocking selectivity of the dual-mode filter can be achieved and comprising an even-numbered finger plurality of the (first) transducers.

FIG. 7 shows a further development of the invention with which (additionally) a higher blocking selectivity of the dual-mode filter can be achieved. The principle of the filter according to FIG. 7 further comprises what are always an even-numbered finger plurality of the (first) transducers 11', 111 and, here, additionally the transducer 11".

The new principle of the filter according to FIG. 7 is that—compared to the filter according to FIG. 2—the track 10 of this filter is divided here into two tracks 10' and 10", each having an aperture that is half the size as the (middle) track 110'. Given the filter of FIG. 7, the terminal a of the transducer 11' is connected to the terminal a of the transducer 11", and the terminal b of the transducer 11' is connected to the terminal b of the transducer 11". The two (first) transducers 11' and 11" are thus connected electrically parallel. The interconnection of the (second) transducers (the coupling transducers in FIG. 2 and FIG. 7) of the two tracks 10' and 10" to one another, namely the transducer 21' and 22' on the one hand and 21" and 22" on the other hand to the transducer 221 or, respectively, 222 of the track 110' proceeds from FIG. 7. This is an in-phase circuit, as in FIG. 2. The reflector structures 31' and 31" have proceeded from the reflector structures 31 of track 10 by the division into the tracks 10' and 10". The reflectors of the track 110' are referenced 31.

The (second) coupling transducers 221 and 222 of the track 110' are a further special characteristic of this developed embodiment of the invention. As can be seen from the Figure, they are divided into two parts. The coupling transducer 221 is composed of two parts 221$_1$ and 221$_2$ (as can be seen from the Figure ), namely two interdigital transducers that form a unit as a result of the structural design. The phase of the acoustic wave field within the transducer 221 or, respectively, 222 is thereby respectively constant perpendicular to the wave propagation direction. The difference in impedance between the terminals amounts to four times or, respectively, to one-fourth. The same is also true of the coupling transducer 222 and its parts 222$_1$ and 222$_2$.

The functioning of the filter according to FIG. 7 is as follows: the two input filter tracks 10' and 10" are formed due to the splitting, these also being symmetrically inserted into the filter structure. The impedance of every first and second transducer 11', 21'. 22' and 11", 21", 22" contained therein is, as a consequence of the halved aperture, twice as great as that of a transducer 11, 21 and 22. Since the transducers 11' and 11" are connected parallel, the same high input impedance is present as given the filter of FIG. 2 and as in the track 110. The transducers 21' and 21" as well as 22' and 22" are respectively connected in series in the illustrated circuit. The impedance of the individual transducer is thus four times as high compared to the transducers 21, 22 of FIG. 2. Since, however, the split transducer 221 (and the transducers 222 as well) is composed of series-connected transducer parts, its impedance is likewise comparatively four times as high.

This development of the invention according to FIG. 7 has an impedance of the same size in this development at the input side and output side as is the case for the filters of FIGS. 1 through 3 and as is usually required in practice.

Figure 9B:
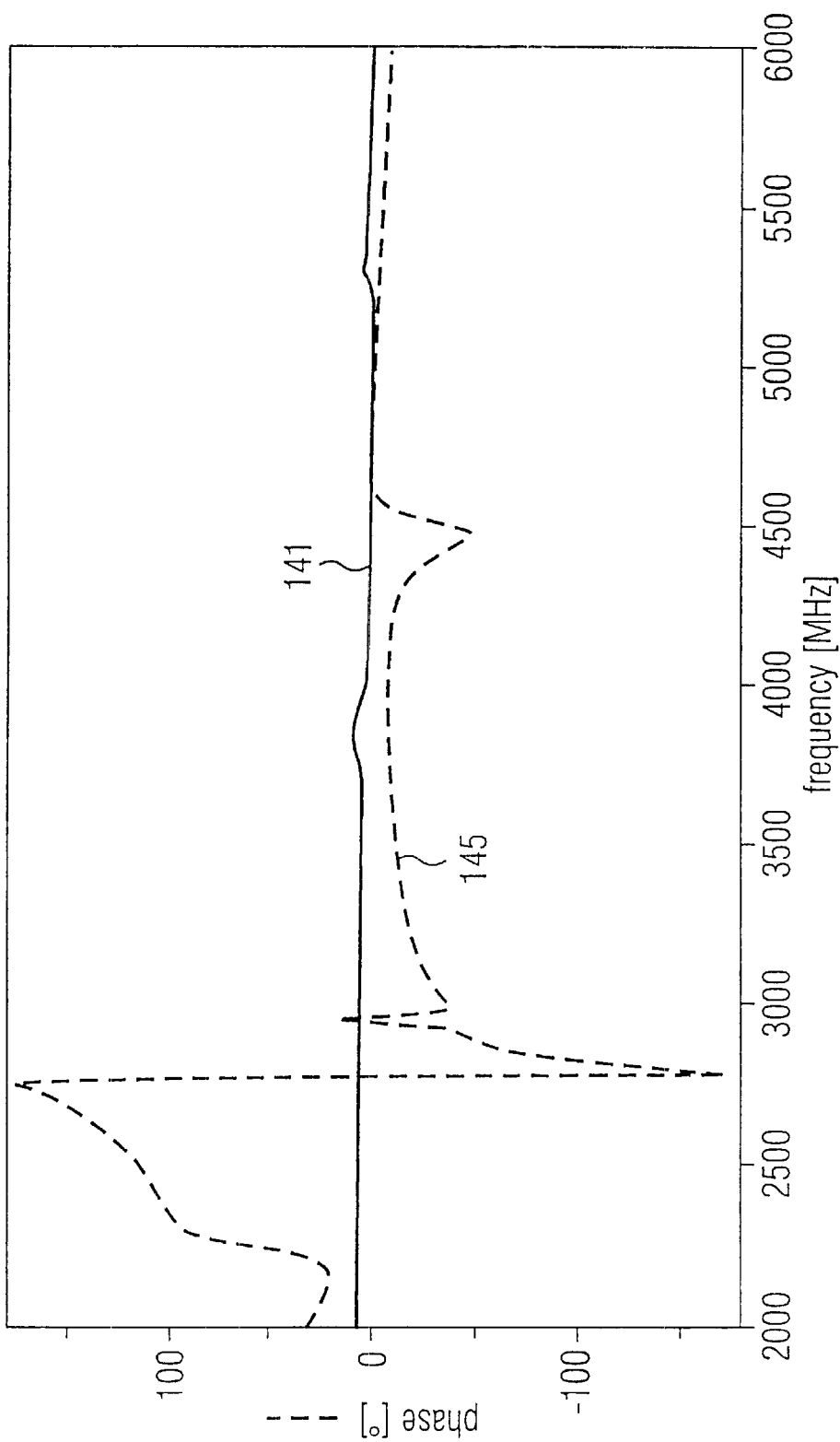

The filter of FIG. 7 already has a high symmetry property because of the structural design. This can be seen from the measured curves 41 for the symmetry and 141 for the phase curve according to FIGS. 8A and 8B. The description of FIGS. 4A and 4B can be referenced for further explanation of FIGS. 8A and 8B. Due to its even more improved structural design in view of the symmetry on the surface of the substrate of such a filter, the filter of FIG. 7 has an especially high signal symmetry and, additionally, improve blocking attenuation. FIGS. 9A and 9B show the curve 41 of the symmetry of the signal of the filter and the appertaining phase curve 141 in the region outside the prescribed filter band 42, in the frequency range from 2 through 6 GHz. The broken-line curves 45 and 145 in these Figures show the comparison values of a filter of the prior art.

Figure 10:
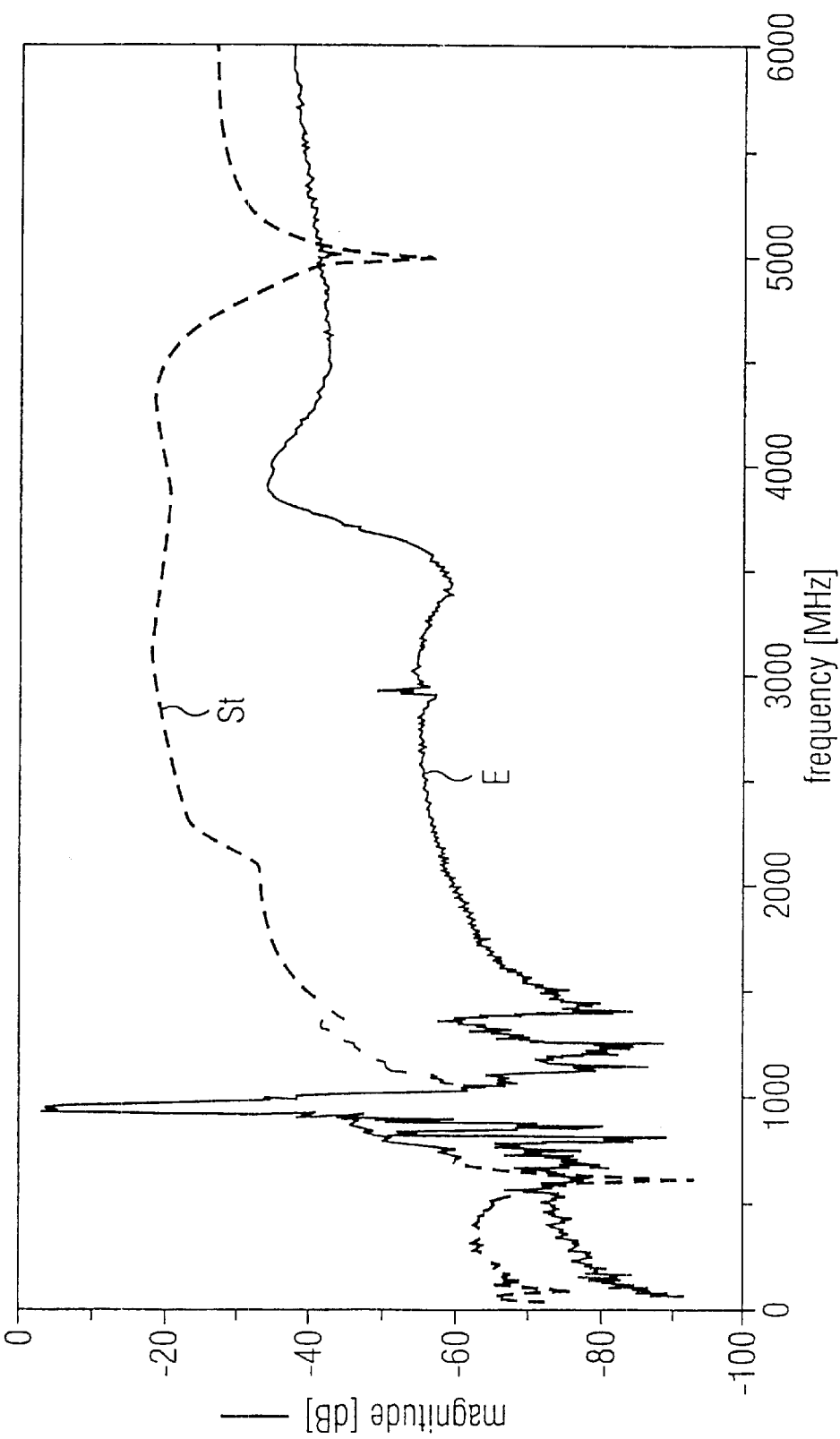
FIG. 10 is a graph showing the transfer behavior of a filter of FIG. 7 having two first tracks connected electrically parallel and a third track 110'.

FIG. 10 shows the transfer behavior of a filter of FIG. 7 having two first tracks 10', 10" connected electrically in parallel, and the third track 110'. This filter of FIG. 7 has balance nonfunctionality. The curve E shows the transfer behavior of a filter according to FIG. 7, and the curve St shows that of a two-track filter of the prior art according to FIG. 13B.

FIG. 11 shows a development of the embodiment of the invention of FIG. 7 that is essentially analogous to the development of FIG. 6 (and, thus, according to FIG. 5 as well) of the embodiments according to FIGS. 1 through 3. Explanations provided in the descriptions of these other embodiments apply analogously for the embodiment of FIG. 11. The same is true for the reference characters of the previous Figures also used in FIG. 11, in which 11'$a$, 11'$b$, etc., again reference the (first) transducer with an inventively even-numbered finger plurality and point-symmetrical structure of the one track 10'. The same is true of the (first) transducers 11"$a$, 11"$b$, . . . , of the other track 10". Here, too, these tracks 10' and 10" are compared to a track 10 of a two-track filter. The transducers 111$a$, 111$b$, . . . , of the middle, third track in FIG. 11 are likewise such first transducers.

These first transducers of the tracks 10', 10" and 110' are connected electrically in parallel to one another within the respective track. These parallel circuits of the tracks 10' and 10" are again electrically connected in parallel to one another, namely by connecting the terminals respectively referenced a and b. In FIG. 11, this parallel circuit, i.e., the terminals a and b, are declared as an input (IN) of the filter. These (first) are provided n-fold in each of the tracks 10' and 10". The (second) transducers 21'$a$, 21'$b$ . . . , 21'$_{n+1}$ and 21"$a$, 21"$b$, . . . , 21"$_{n+1}$ of the tracks 10' and 10" and 221$a$, 221$b$, . . . , 221$_{n+1}$ of the track 110 serve as coupling transducers and are provided in an (n+1)-fold plurality in comparison. These (second) transducers are also connected electrically in parallel to one another in the respective track, as can be derived from FIG. 11. Moreover, these (second) transducers—as shown in FIG. 11—are electrically connected to one another between the individual tracks, namely in their function as coupling transducers of the illustrated three-track filter that, due to the electrical interconnection, is a filter of the type of a two-track filter. The standard reflectors of the respective track are referenced 31', 31" and 31.

Such a multi-track filter according to FIG. 11 having the enhanced and structurally implemented symmetry of a filter according to FIG. 7, also achieves the advantages that are achieved, on the one hand, with the filter according, for example, to FIG. 6 and, on the other hand, a filter according to FIG. 7 when compared to the prior art.

As in FIG. 7, the filter of FIG. 11 exhibits second transducers 221a, etc. of the middle, third track 110' that—as described above regarding FIG. 7—are composed of parts 221₁ and 221₂ that are connected electrically in series and act connected in parallel in wave-acoustic terms.

Figure 12A:
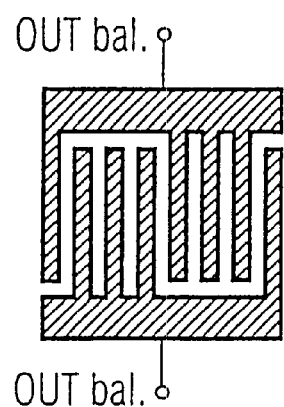
FIGS. 12A–12D are pictorial diagrams showing various embodiments of transducers that can be employed for first and second transducers of the invention.
Figure 12B:
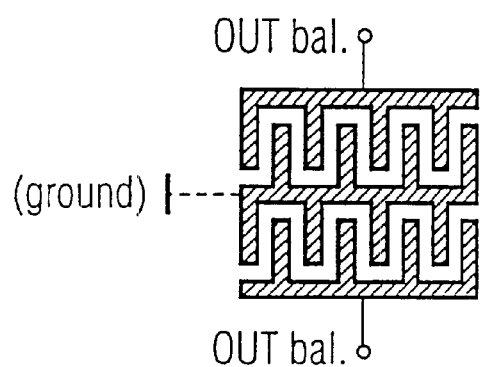
Figure 12C:
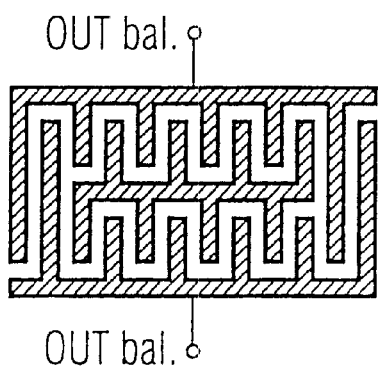
Figure 12D:
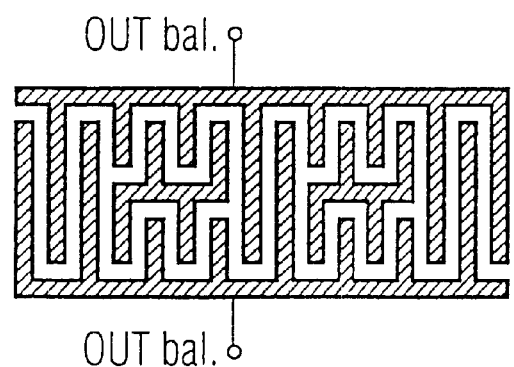

FIGS. 12A–12D show a few examples of embodiments of transducers as can be employed for first and second transducers of the invention or the illustrated embodiment types, namely as weighted transducer (FIG. 12A) and/or as transducer or (FIGS. 12B through 12D) with impedance transformation. Overall, the transducer of FIG. 12A again has an even-numbered finger plurality. The same is also true of the transducers of FIGS. 12B, 12C and 12D. The transducer of FIG. 12B has an impedance transformation ratio of 1:4 (or 4:1). The transducers of FIGS. 12C and 12D are fashioned such that they form a ratio of the impedance transformation that deviates from a whole number (selectively). What these transducers of FIGS. 12A through 12D also have in common in terms of being important to the invention is that they are point-symmetrically implemented in view of their symmetry.

The above-described apparatus is illustrative of the principles of the present invention. Numerous modifications and adaptations will be readily apparent to those skilled in this art without departing from the spirit and scope of the present invention.

What is claimed is:

1. A dualmode surface acoustic wave filter comprising:
   an input terminal and an output terminal, at least one of the input terminal and the output terminal being balanced;
   a first filter track and a second filter track, each track comprising:
      at least one first transducer comprising an even-numbered plurality of transducer fingers electrically connected to a respective busbar and arranged interdigitally;
      a plurality of second transducers, each second transducer comprising an even-numbered plurality of transducer fingers electrically connected to a respective busbar and arranged interdigitally; and
      reflector structures;
   wherein:
      the second transducers serve as coupling transducers, the second transducers of the first filter track being electrically connected to respective second transducers of the second filter track, and the at least one first transducer of the first track serving as an input transducer;
      the at least one first transducer of the second filter track serving as an output transducer;
      at least one balanced terminal chosen from the input and output terminal being electrically connected to the busbars of the respective input and output transducer;
      in each filter track, a finger arrangement of the first transducer being point-symmetrical with respect to a center of the respective transducer;
      in each filter track, the at least one first transducer being arranged between two respective second transducers;
      in a respective track, a finger arrangement of the two second transducers being point-symmetrical to one another with respect to a center of the corresponding first transducer; or
      in a respective track, a finger arrangement of the two second transducers being mirror-symmetrical to one another with respect to an axis that is orthogonal to a wave propagation direction, which axis passes through the center of the corresponding first transducer.

2. The filter according to claim 1, comprising in each of the first filter track and the second filter track, respectively:
   an n-fold a plurality of first transducers being connected electrically in parallel to one another, n being an integer>1;
   an (n+1)-fold a plurality of second transducers connected electrically in parallel to one another;
   the plurality of the first transducers of the first filter track being electrically connected to the input terminal;
   the plurality of the first transducers of the second filter track being electrically connected to the output terminal.

3. The filter according to claim 2, comprising more than one first track.

4. The filter according to claim 1, wherein:
   the filter comprises two first filter tracks,
   the first transducers of two first filter tracks being connected electrically in parallel with one another with respect to the input terminal;
   the second transducers of the second track are electrically coupled to the second transducers of the two first tracks;
   the respective second transducer of the second track and the respective second transducers of the two first tracks being connected in series, the respective second transducer of the second track being arranged between the respective second transducers of the two first tracks.

5. The filter according to claim 4, wherein each of the filter tracks comprise:
   a respective n-fold plurality of first transducers connected electrically in parallel to one another, n being an integer>1; and
   an (n+1) plurality of second transducers connected electrically in parallel to one another; the n-fold plurality of the first transducers of the first filter track being electrically connected to the input terminal;
   the n-fold plurality of the first transducers of the second filter track being electrically connected to the output terminal.

6. The filter according to claim 1, wherein, in at least one of the first track and the second track, the at least one first transducer and the second transducers of the respective track are weighted.

7. The filter according to claim 1, wherein at least one of the first transducer and the second transducers of the respective filter tracks comprise:
   an impedance transformation in that the respective transducer comprises sub-transducers that are electrically connected in series with each other and wave-acoustically arranged parallel to each other.

* * * * *